(12) United States Patent
Fujii

(10) Patent No.: US 10,629,372 B2
(45) Date of Patent: Apr. 21, 2020

(54) LAMINATED ELECTRONIC COMPONENT AND MOUNTING STRUCTURE THEREOF

(71) Applicant: Murata Manufacturing Co., Ltd., Nagaokakyo-shi, Kyoto-fu (JP)

(72) Inventor: Yasuo Fujii, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 250 days.

(21) Appl. No.: 14/202,457

(22) Filed: Mar. 10, 2014

(65) Prior Publication Data
US 2014/0284091 A1 Sep. 25, 2014

(30) Foreign Application Priority Data

Mar. 19, 2013 (JP) .................. 2013-056461
Jan. 7, 2014 (JP) .................. 2014-001174

(51) Int. Cl.
*H01G 2/02* (2006.01)
*H01G 2/06* (2006.01)
(Continued)

(52) U.S. Cl.
CPC ............. *H01G 2/06* (2013.01); *H01G 4/232* (2013.01); *H01G 4/30* (2013.01); *H05K 1/181* (2013.01);
(Continued)

(58) Field of Classification Search
CPC H01G 2/06; H01G 2/02; H01G 2/065; H01G 4/232; H01G 4/30; H01G 4/12; H01G 4/228; H01R 4/26; H01R 4/28; H01R 4/48; H01R 4/4818; H01R 4/4845; H01R 9/226; H01R 9/22; H01R 11/01; H01R 11/03; H01R 12/515; H01R 12/58; H01R 12/7064; H01R 12/716; H01R 12/778;
(Continued)

(56) References Cited

U.S. PATENT DOCUMENTS 6,304,425 B1 10/2001 Mamada
2004/0183147 A1* 9/2004 Togashi ................. H01G 2/065
257/414
(Continued)

FOREIGN PATENT DOCUMENTS

JP 2000-232030 A 8/2000
JP 2004288847 A * 10/2004
JP 2012033654 A * 2/2012

*Primary Examiner* — Timothy J Thompson
*Assistant Examiner* — Guillermo J Egoavil
(74) *Attorney, Agent, or Firm* — Keating & Bennett, LLP

(57) ABSTRACT

A laminated electronic component includes a laminate including internal electrodes and dielectric layers laminated alternately and a first main surface, an external electrode that continuously covers at least one end surface of the laminate in a longitudinal direction and a portion of the first main surface adjacent to the one end surface, and a conductive elastic structure connected to the external electrode at at least corner portions of the first main surface in a portion where the external electrode covers the first main surface. The elastic structure includes a base portion connected to the external electrode to extend along the first main surface, and a branch portion branched from the base portion and extending at a position spaced from the first main surface to connect to another electrode, and having elasticity.

15 Claims, 10 Drawing Sheets

(51) Int. Cl.
  *H01G 4/12*   (2006.01)
  *H01G 4/30*   (2006.01)
  *H01G 4/232*  (2006.01)
  *H05K 1/18*   (2006.01)
  *H05K 3/34*   (2006.01)

(52) U.S. Cl.
  CPC ............. *H01G 4/12* (2013.01); *H05K 3/3442* (2013.01); *H05K 2201/0311* (2013.01); *H05K 2201/10015* (2013.01); *H05K 2201/10636* (2013.01); *H05K 2201/10962* (2013.01); *Y02P 70/611* (2015.11)

(58) Field of Classification Search
  CPC .............. H01R 12/714; H01R 13/2442; H01R 13/111; H01R 13/113; H01R 13/114; H01R 13/187; H01R 13/24; H01R 13/6582; H01R 43/16; H01R 43/24; H01R 2201/16; H05K 1/181; H05K 3/3442; H05K 3/3426; H05K 2201/0311; H05K 2201/10015; H05K 2201/10636; H05K 2201/10962; H05K 2201/10946; Y02P 70/611; Y02P 70/613
  USPC ................. 174/260; 361/301.4; 257/414
  See application file for complete search history.

(56) References Cited

U.S. PATENT DOCUMENTS

| | | | | |
|---|---|---|---|---|
| 2005/0124181 | A1* | 6/2005 | Brown | H01L 24/72 439/66 |
| 2006/0238948 | A1* | 10/2006 | Tominaga | H01G 4/232 361/118 |
| 2006/0258218 | A1* | 11/2006 | Chen | H01R 9/226 439/607.35 |
| 2008/0186652 | A1* | 8/2008 | Lee | H01G 4/012 361/306.3 |
| 2010/0188798 | A1* | 7/2010 | Togashi | H01G 2/06 361/306.3 |
| 2012/0108108 | A1* | 5/2012 | Horikawa | H01R 12/716 439/626 |
| 2012/0261554 | A1* | 10/2012 | Yoshihara | H01L 27/14618 250/208.1 |
| 2015/0024640 | A1* | 1/2015 | Yamada | H01R 13/2442 439/786 |

\* cited by examiner ically and advantages of the present invention will become
LAMINATED ELECTRONIC COMPONENT AND MOUNTING STRUCTURE THEREOF

BACKGROUND OF THE INVENTION

1. Field of the Invention

The present invention relates to a laminated electronic component and a mounting structure thereof.

2. Description of the Related Art

In recent years, as development of electronic equipment with higher performance advances rapidly, laminated ceramic capacitors have larger capacitances. In a large-capacitance laminated ceramic capacitor, a high dielectric ceramic such as barium titanate is used as a material constituting a dielectric.

Such a high dielectric ceramic has piezoelectric and electrostrictive properties. Thus, a laminated ceramic capacitor including a dielectric made of a high dielectric ceramic has a mechanical strain when a voltage or an electric field is applied thereto.

Therefore, when an alternating current (AC) voltage, or a direct current (DC) voltage having an AC component superimposed thereon is applied to the laminated ceramic capacitor, vibration due to the mechanical strain is generated. When the laminated ceramic capacitor is connected to a circuit substrate, the vibration is transmitted to the circuit substrate, causing the circuit substrate to vibrate.

When vibration of the air around the circuit substrate thus generated is within a range of 20 Hz to 20 kHz, which is the audible frequency range, it generates an unpleasant sound to human ear. This sound-generating phenomenon is called "acoustic noise".

Conventionally, some proposals have been made to prevent and suppress such acoustic noise. One exemplary technique for reducing acoustic noise is described in Japanese Patent Laying-Open No. 2000-232030.

In a method for mounting laminated ceramic capacitors on a circuit substrate described in Japanese Patent Laying-Open No. 2000-232030, lands for mounting the capacitors which are conductive to each other are formed on both front and back surfaces of the circuit substrate at substantially plane-symmetrical positions, and the laminated ceramic capacitors are arranged on these lands, respectively, for conductive connection. In this technique, it is expected that vibration transmitted from one laminated ceramic capacitor to the circuit substrate and vibration transmitted from the other laminated ceramic capacitor to the circuit substrate cancel each other out and suppress generation of acoustic noise.

According to the invention described in Japanese Patent Laying-Open No. 2000-232030, it is necessary to mount two laminated ceramic capacitors having an equal specification on both of the front and back surfaces of the circuit substrate, and thus the degree of freedom in designing the circuit substrate is lost.

SUMMARY OF THE INVENTION

Accordingly, preferred embodiments of the present invention provide a laminated electronic component capable of reducing acoustic noise while maintaining the degree of freedom in designing a circuit substrate, and a mounting structure thereof.

A laminated electronic component in accordance with a preferred embodiment of the present invention includes a laminate including internal electrodes and dielectric layers laminated alternately, and including a first main surface; an external electrode provided to continuously cover at least one end surface of the laminate in a longitudinal direction and a portion of the first main surface adjacent to the one end surface; and a conductive elastic structure connected to the external electrode at at least corner portions of the first main surface in a portion where the external electrode covers the first main surface. The elastic structure includes a base portion connected to the external electrode to extend along the first main surface, and a branch portion branched from the base portion and extending at a position spaced from the first main surface to connect to another electrode, and having elasticity.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First, a laminated ceramic capacitor element will be described as one example of a laminated capacitor element included in a laminated electronic component in accordance with a preferred embodiment of the present invention.

As the laminated capacitor element included in the laminated electronic component in accordance with a preferred embodiment of the present invention, a laminated ceramic capacitor element using a dielectric ceramic, a laminated metallized film capacitor element using a dielectric resin film, or the like can be adopted.

Hereinafter, a description will be given, taking a laminated ceramic capacitor element as an example.

Figure 1:
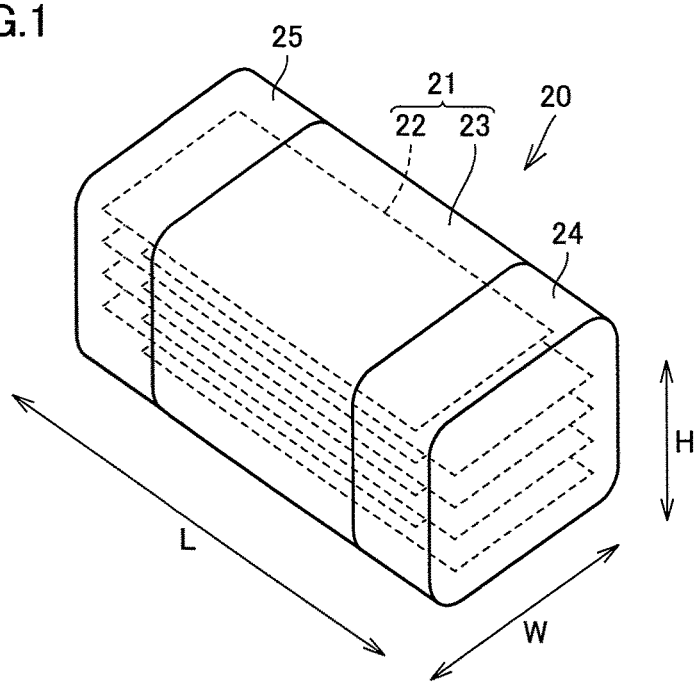
FIG. 1 is a perspective view of a laminated ceramic capacitor element included in a laminated electronic component in accordance with a preferred embodiment of the present invention.

FIG. 1 shows one example of a laminated ceramic capacitor element. A lamination direction of a laminate of the laminated ceramic capacitor element is defined as a thickness direction, and the thickness direction is indicated by H. In FIG. 1, a direction of a long side and a direction of a short side of a laminated ceramic capacitor element 20 as viewed in plan view from the thickness direction are indicated by L and W, respectively.

Laminated ceramic capacitor element 20 shown in FIG. 1 includes a laminate 21 that is preferably rectangular or substantially rectangular parallelepiped, for example, an external electrode 24 provided at one end portion of laminate 21 in a longitudinal direction, and an external electrode 25 provided at the other end portion of laminate 21 in the longitudinal direction. In the example shown in FIG. 1, external electrode 24 and external electrode 25 have shapes symmetrical to each other. Laminate 21 includes flat plate shaped internal electrodes 22 and dielectric layers 23 laminated alternately. Internal electrodes 22 preferably include two types: one type is electrically connected to external electrode 24 and is not electrically connected to external electrode 25, and the other type is electrically connected to external electrode 25 and is not electrically connected to external electrode 24. These two types of internal electrodes 22 are arranged alternately along thickness direction H. Internal electrodes 22 adjacent to each other along thickness direction H are electrically isolated from each other by dielectric layer 23.

Dielectric layer 23 is composed of a ceramic sheet primarily made of, for example, barium titanate, i.e., $BaTiO_3$. However, dielectric layer 23 is not limited to the one primarily made of $BaTiO_3$, and any high dielectric ceramic may be used therefor. The primary material may be $CaTiO_3$, $CaTiO_3$, $SrTiO_3$, $CaZrO_3$, or the like, instead of $BaTiO_3$. Further, as an accessory component of ceramic powder, an Mn compound, an Mg compound, an Si compound, a Co compound, an Ni compound, a rear earth compound, or the like may be added to the ceramic sheet serving as dielectric layer 23.

Internal electrode 22 preferably is formed as a metal film by printing a paste containing Ni on a surface of the ceramic sheet constituting dielectric layer 23. However, the primary material for internal electrode 22 is not limited to Ni, and may be, for example, Ni, Cu, Ag, Pd, an Ag—Pd alloy, Au, or the like.

Laminate 21 has rounded ridge line portions and corner portions.

External electrodes 24, 25 have a laminated structure in which several kinds of metal films of Ni, Sn, and the like are laminated in order. Each of external electrodes 24, 25 may include a combination of a sintered metal layer and a plating layer. The sintered metal layer is preferably formed by baking a paste of Cu, Ni, Ag, Pd, an Ag—Pd alloy, Au, or the like on laminate 21. When each of external electrodes 24, 25 includes a combination of a sintered metal layer and a plating layer, it may be formed by, for example, forming one or more plating layers on the sintered metal layer. Specifically, the "one or more plating layers" provided on the sintered metal layer may be a single plating layer or a plating layer group. For example, the plating layer group on the sintered metal layer may be a combination of an Ni plating layer and an Sn plating layer arranged to cover the Ni plating layer. The plating layer group may include a Cu plating layer and an Au plating layer. It is noted that external electrodes 24, 25 may not include a sintered metal layer, and may include a plating layer or a plating layer group only.

When an AC voltage, or a DC voltage having an AC voltage superimposed thereon is applied to laminated ceramic capacitor element 20, a mechanical strain is generated in laminated ceramic capacitor element 20 due to a piezoelectric effect caused by dielectric layers 23. The strain is transmitted to a circuit substrate and deforms the circuit substrate, which causes acoustic noise.

The inventors have studied how laminated ceramic capacitor element 20 is deformed when acoustic noise is generated. Exemplary deformation of laminated ceramic capacitor element 20 will be described with reference to FIGS. 2 to 5. FIGS. 2 to 5 show laminated ceramic capacitor element 20 as viewed from the circuit substrate side, and FIGS. 3 and 5 show deformation of an external shape of laminated ceramic capacitor element 20 in an exaggerated manner.

Figure 2:
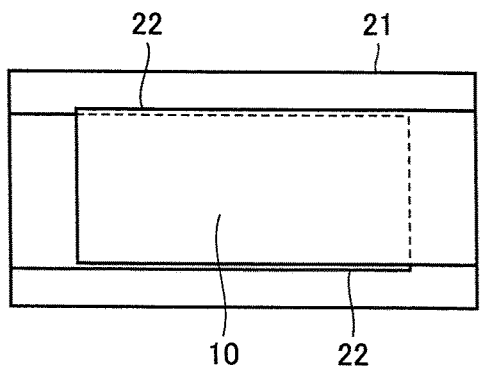
FIG. 2 is a view of the state of a laminated ceramic capacitor element before being deformed, in a case where internal electrodes are parallel or substantially parallel to a main surface of a circuit substrate, as viewed from the circuit substrate side.
Figure 3:
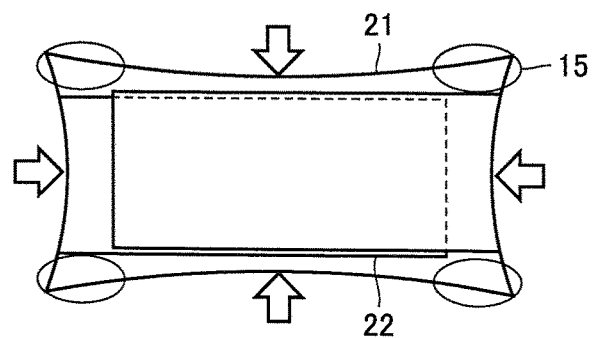
FIG. 3 is a view of the state of the laminated ceramic capacitor element after being deformed, in the case where the internal electrodes are parallel or substantially parallel to the main surface of the circuit substrate, as viewed from the circuit substrate side.

FIG. 2 shows laminated ceramic capacitor element 20 before being deformed, in a case where internal electrodes 22 are parallel or substantially parallel to a main surface of the circuit substrate, as viewed from the circuit substrate side. FIG. 3 shows a state in which laminated ceramic capacitor element 20 is deformed. In this example, when an AC voltage is applied, laminated ceramic capacitor element 20 changes alternately between the state shown in FIG. 2 and the state shown in FIG. 3. Alternatively, when a voltage prepared by superimposing an AC voltage on an DC voltage is applied to laminated ceramic capacitor element 20, laminated ceramic capacitor element 20 changes alternately between the state in which the degree of deformation in FIG. 3 is low and the state in which the degree of deformation in FIG. 3 is high.

Figure 4:
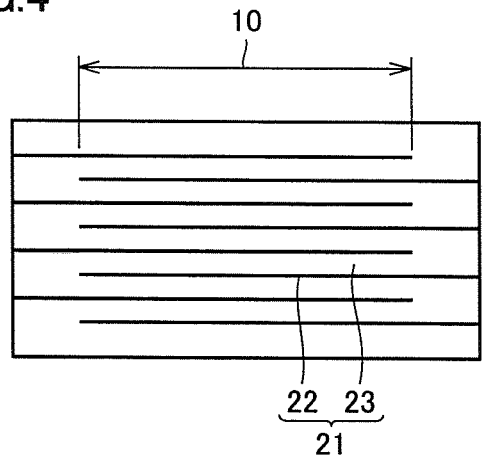
FIG. 4 is a view of the state of the laminated ceramic capacitor element before being deformed, in a case where the internal electrodes are perpendicular or substantially perpendicular to the main surface of the circuit substrate, as viewed from the circuit substrate side.
Figure 5:
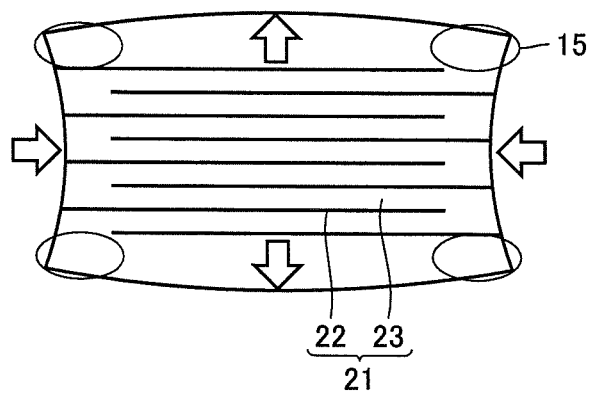
FIG. 5 is a view of the state of the laminated ceramic capacitor element after being deformed, in the case where the internal electrodes are perpendicular or substantially perpendicular to the main surface of the circuit substrate, as viewed from the circuit substrate side.

On the other hand, FIG. 4 shows laminated ceramic capacitor element 20 before being deformed, in a case where internal electrodes 22 are perpendicular or substantially perpendicular to the main surface of the circuit substrate, as viewed from the circuit substrate side. FIG. 5 shows a state in which laminated ceramic capacitor element 20 is deformed. In this example, when an AC voltage is applied, laminated ceramic capacitor element 20 changes alternately between the state shown in FIG. 4 and the state shown in FIG. 5. Alternatively, when a voltage prepared by superimposing an AC voltage on an DC voltage is applied to laminated ceramic capacitor element 20, laminated ceramic capacitor element 20 changes alternately between the state in which the degree of deformation in FIG. 5 is low and the state in which the degree of deformation in FIG. 5 is high.

Since the strain in laminated ceramic capacitor element 20 is due to the piezoelectric effect of dielectric layers 23, the strain is mainly generated in a region where internal electrodes 22 face each other with dielectric layer 23 sandwiched therebetween, that is, a so-called effective region 10 shown in FIGS. 2 and 4. Therefore, the inventors have discovered that, in any of the cases shown in FIGS. 3 and 5, the vicinity of the center of each side of laminated ceramic capacitor element 20 as viewed from the circuit substrate side has a large amount of displacement, whereas corner portions 15 at four corners of laminated ceramic capacitor element 20 have a small amount of displacement.

Based on these discoveries, the inventors have determined that acoustic noise can be significantly reduced or prevented by combining a predetermined elastic structure with the laminated ceramic capacitor element as described below.

Preferred Embodiment 1

Figure 6:
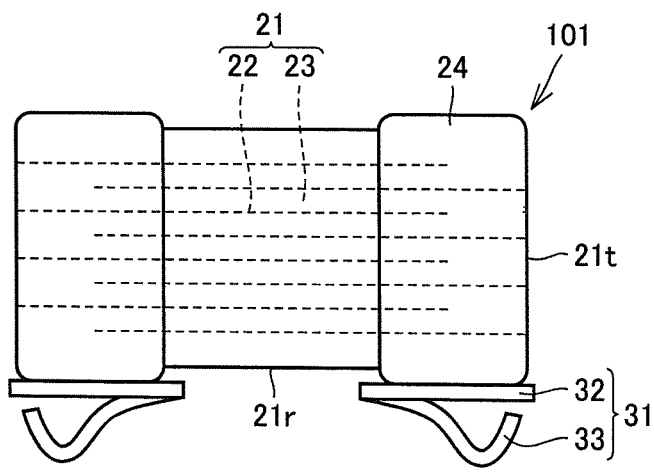
FIG. 6 is a side view of a laminated electronic component in Preferred Embodiment 1 in accordance with the present invention.

A laminated electronic component in Preferred Embodiment 1 in accordance with the present invention will be described with reference to FIGS. 6 and 7. FIG. 6 shows a side view of a laminated electronic component 101 in the present preferred embodiment. Laminated electronic component 101 includes laminate 21, preferably having a rectangular or substantially rectangular parallelepiped shape, including internal electrodes 22 and dielectric layers 23 laminated alternately and including a first main surface 21r, external electrode 24 provided to continuously cover at least one end surface 21t of laminate 21 in the longitudinal direction and a portion of first main surface 21r adjacent to one end surface 21t, and a conductive elastic structure 31 connected to external electrode 24 at at least corner portions 15 of first main surface 21r in a portion where external electrode 24 covers first main surface 21r. Elastic structure 31 includes a base portion 32 connected to external electrode 24 to extend along first main surface 21r, and a branch portion 33 branched from base portion 32 and extending at a position spaced from first main surface 21r to connect to another electrode, and having elasticity.

Figure 7:
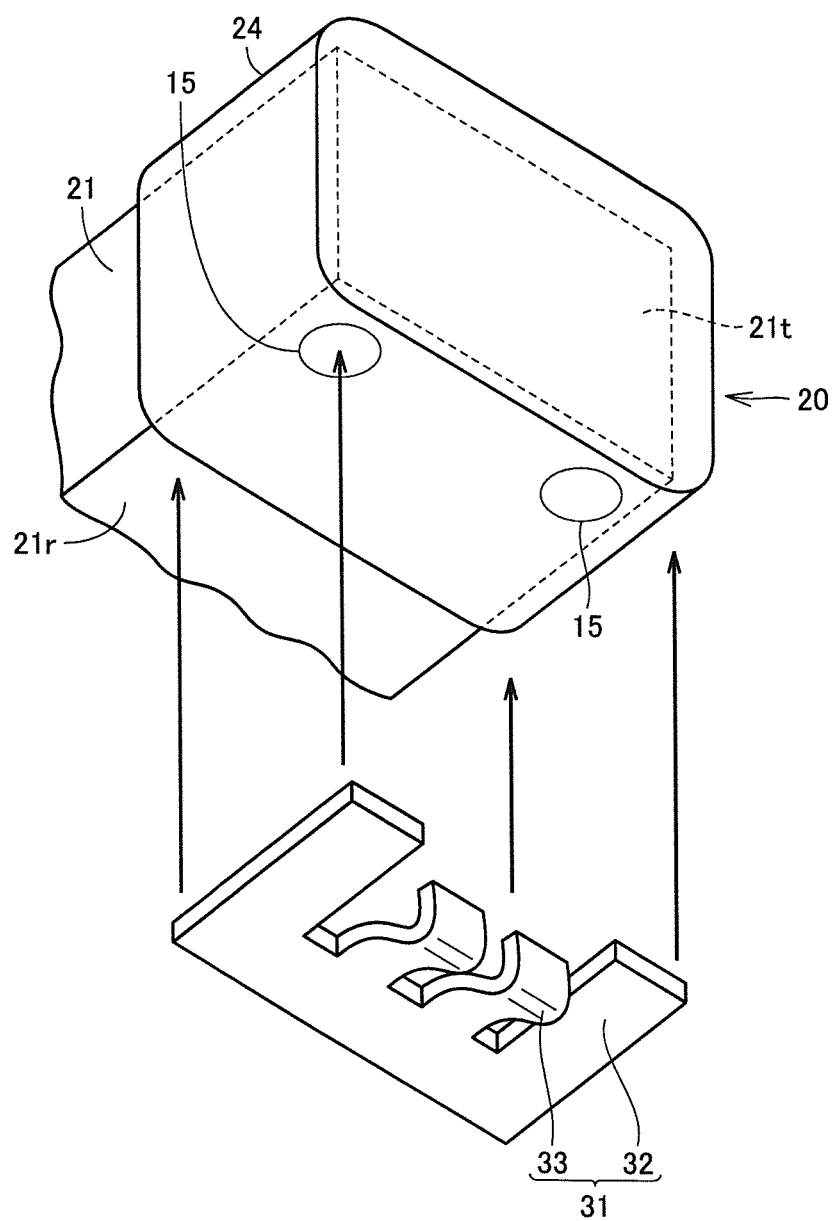
FIG. 7 is an exploded view of the vicinity of an external electrode of the laminated electronic component in Preferred Embodiment 1 in accordance with the present invention.

FIG. 7 shows an exploded view of the vicinity of external electrode 24 of laminated electronic component 101. Elastic structure 31 is attached to external electrode 24 of laminated ceramic capacitor element 20 in this manner. Elastic structure 31 may be joined to external electrode 24 by adhesion with a conductive adhesive, by soldering, or by welding, for example.

Elastic structure 31 can be formed of, for example, Ni, Fe, Cu, Ag, Cr, or an alloy containing any of these metals as a primary component. When elastic structure 31 is formed of a plate material, the plate material may initially have a thickness of, for example, about 0.05 mm to about 0.5 mm. The tip end of branch portion 33 of elastic structure 31 may be bent toward laminate 21 to hold solder when branch portion 33 is connected to a land described later. Preferably, in the example shown in FIG. 7, the tip end of branch portion 33 is bent toward laminate 21.

Since laminated electronic component 101 in the present preferred embodiment includes elastic structure 31, laminated electronic component 101 can be mounted on a circuit substrate with elastic structure 31 interposed therebetween, as described later in Preferred embodiment 2. Since elastic structure 31 is connected to external electrode 24 at at least corner portions 15, and corner portion 15 is a portion with small displacement as described above, vibration in laminate 21 caused by the piezoelectric effect is less likely to be transmitted to elastic structure 31. Further, even if the vibration is transmitted to elastic structure 31, elastic structure 31 plays a role of attenuating the vibration, because it includes branch portion 33 having elasticity. Therefore, elastic structure 31 reduces the degree of transmission of the vibration to the circuit substrate. Thus, when laminated electronic component 101 is mounted, there is no need to mount another laminated electronic component having an equal specification on the back surface of the circuit substrate, and laminated electronic component 101 can be freely mounted alone at a desired position.

Consequently, the laminated electronic component in the present preferred embodiment can be implemented as a laminated electronic component capable of reducing acoustic noise while maintaining the degree of freedom in designing the circuit substrate.

It is noted that, preferably, base portion 32 and branch portion 33 in elastic structure 31 include an integral plate material, and branch portion 33 is provided by bending and plastically deforming a portion of the plate material. By adopting this configuration, an appropriate elastic structure is easily implemented while suppressing an increase in the number of components.

Although the above description has been made focusing on elastic structure 31 connected to external electrode 24, another elastic structure may also be connected similarly to external electrode 25. Preferably, the elastic structures for external electrode 24 and external electrode 25 are symmetrical to each other.

Figure 8:
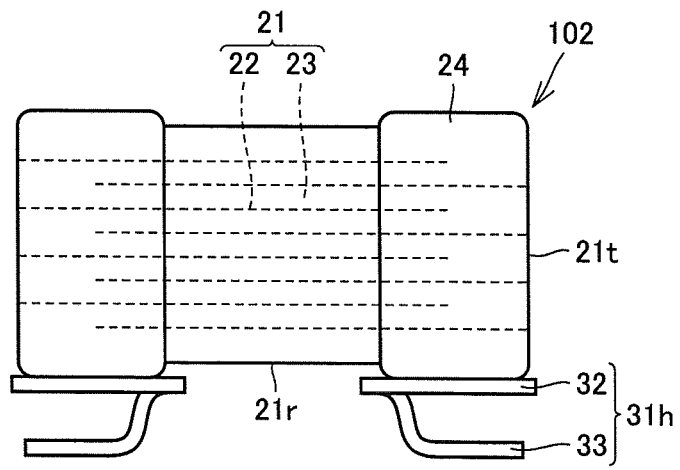
FIG. 8 is a side view of a variation of the laminated electronic component in Preferred Embodiment 1 in accordance with the present invention.

Although laminated electronic component 101 including the elastic structure having a bent shape as viewed from the side has been taken as an example in the present preferred embodiment, the laminated electronic component in accordance with various preferred embodiments of the present invention is not limited to the one including an elastic structure having such a shape. The laminated electronic component in accordance with various preferred embodiments of the present invention may be, for example, a laminated electronic component 102 shown in FIG. 8. Laminated electronic component 102 includes an elastic structure 31h. Elastic structure 31h includes branch portion 33 branched from base portion 32 and extending parallel or substantially parallel to base portion 32. Elastic structures having various other shapes may also be used as an elastic structure provided in the laminated electronic component in accordance with various preferred embodiments of the present invention.

Preferred Embodiment 2

A mounting structure of a laminated electronic component in Preferred Embodiment 2 in accordance with the present invention will be described with reference to FIGS. 9 to 11.

Figure 9:
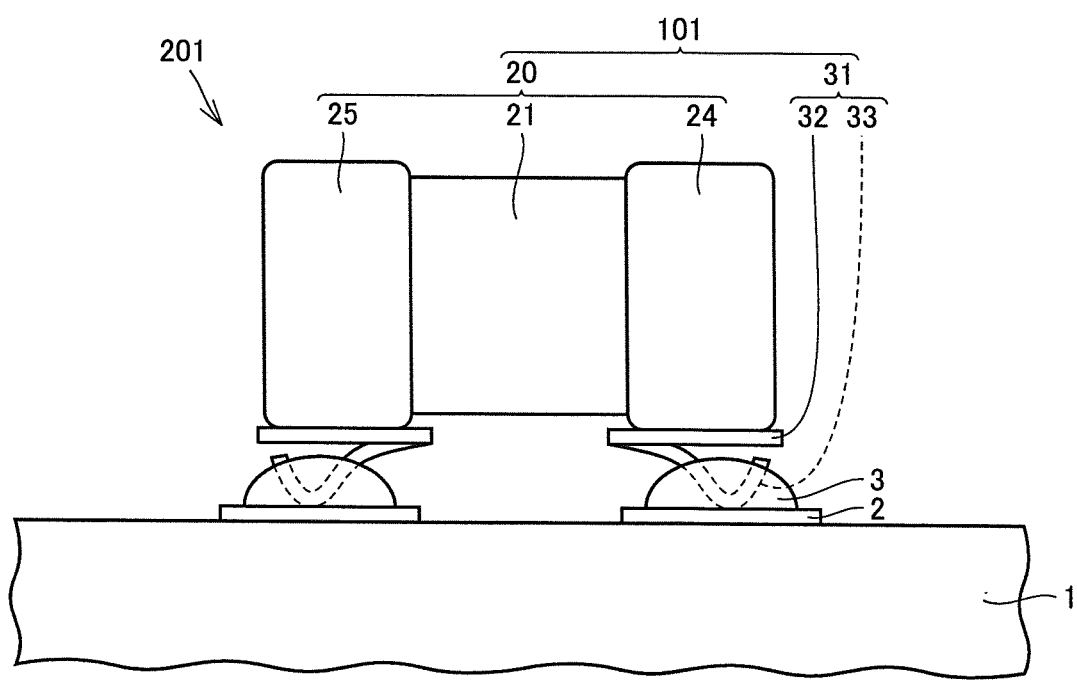
FIG. 9 is a side view of a mounting structure of a laminated electronic component in Preferred Embodiment 2 in accordance with the present invention.

FIG. 9 shows a side view of the mounting structure of a laminated electronic component in the present preferred embodiment.

A mounting structure 201 of a laminated electronic component includes a base material 1, a land 2 arranged on base material 1, and laminated electronic component 101 described in Preferred Embodiment 1, and branch portion 33 of laminated electronic component 101 is joined to land 2 with solder 3 in a state abutting thereon, and solder 3 is not in contact with base portion 32 and laminate 21.

Base material 1 may be, for example, a circuit substrate. Land 2 may be some sort of metal film provided on a surface of the circuit substrate by printing or the like.

Figure 10:
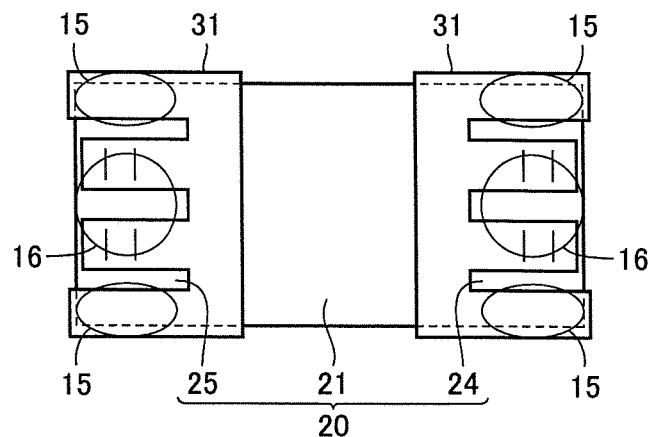
FIG. 10 is an explanatory view of a laminated electronic component included in the mounting structure of the laminated electronic component in Preferred Embodiment 2 in accordance with the present invention, as viewed from the base material side.

FIG. 10 shows laminated electronic component 101 as viewed from the base material 1 side. Elastic structure 31 is connected to laminated ceramic capacitor element 20 at at least corner portions 15. Elastic structure 31 is connected to land 2 in a region 16.

Figure 11:
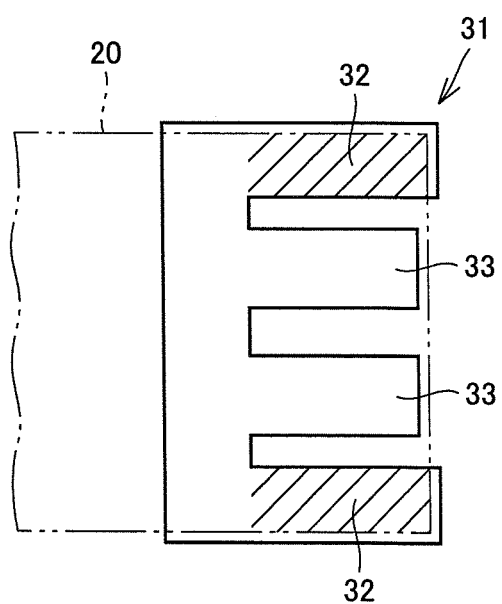
FIG. 11 is an explanatory view of an elastic structure provided in the laminated electronic component included in the mounting structure of the laminated electronic component in Preferred Embodiment 2 in accordance with the present invention.

It can be the that base portion 32 in elastic structure 31 as viewed in plan view is a hatched portion in FIG. 11. However, this is merely one example, and base portion 32 is not limited thereto. Elastic structure 31 may include a portion which belongs to neither base portion 32 nor branch portion 33.

In mounting structure 201 of a laminated electronic component in the present preferred embodiment, laminated electronic component 101 is mounted on each land 2 provided on base material 1 by soldering, with branch portion 33 of elastic structure 31 as a portion of laminated electronic component 101 abutting on the land, and solder 3 for the soldering is not in contact with base portion 32 and laminate 21. Therefore, vibration generated in laminate 21 is prevented from being directly transmitted to solder 3. Since elastic structure 31 is connected to the external electrode at at least corner portions 15, the vibration generated in laminate 21 is less likely to be transmitted to elastic structure 31. Further, even if the vibration is transmitted from laminate 21 to elastic structure 31, it is transmitted to base portion 32 of elastic structure 31. Although the vibration is transmitted from base portion 32 to branch portion 33 in elastic structure 31, the vibration is attenuated while it is transmitted through branch portion 33, because branch portion 33 has elasticity. As a result, transmission of large vibration to solder 3 and land 2 is avoided. Thus, in mounting structure 201 of a laminated electronic component in the present preferred embodiment, acoustic noise is significantly reduced or prevented while maintaining the degree of freedom in designing a circuit substrate.

Although mounting structure 201 of a laminated electronic component has been described in the present preferred embodiment as a mounting structure including laminated electronic component 101 as an example, the mounting structure of a laminated electronic component may include laminated electronic component 102, or another laminated electronic component, instead of laminated electronic component 101.

A non-limiting example of a method for mounting laminated electronic component 101 on a circuit substrate as base material 1 will be described. It is assumed that lands are provided on amounting surface of the circuit substrate at a regular interval. A conductive adhesive or a solder paste is applied to the lands beforehand by screen printing or the like.

When a solder paste is used, laminated electronic component 101 is placed on the lands having the solder paste applied thereto. In this state, these structures are passed through a reflow furnace, and thus a fillet is formed from solder and laminated electronic component 101 is fixed to the circuit substrate as base material 1.

When a conductive adhesive is used, laminated electronic component 101 is placed on the lands having the conductive adhesive applied thereto to perform adhesion.

Preferred Embodiment 3

Figure 12:
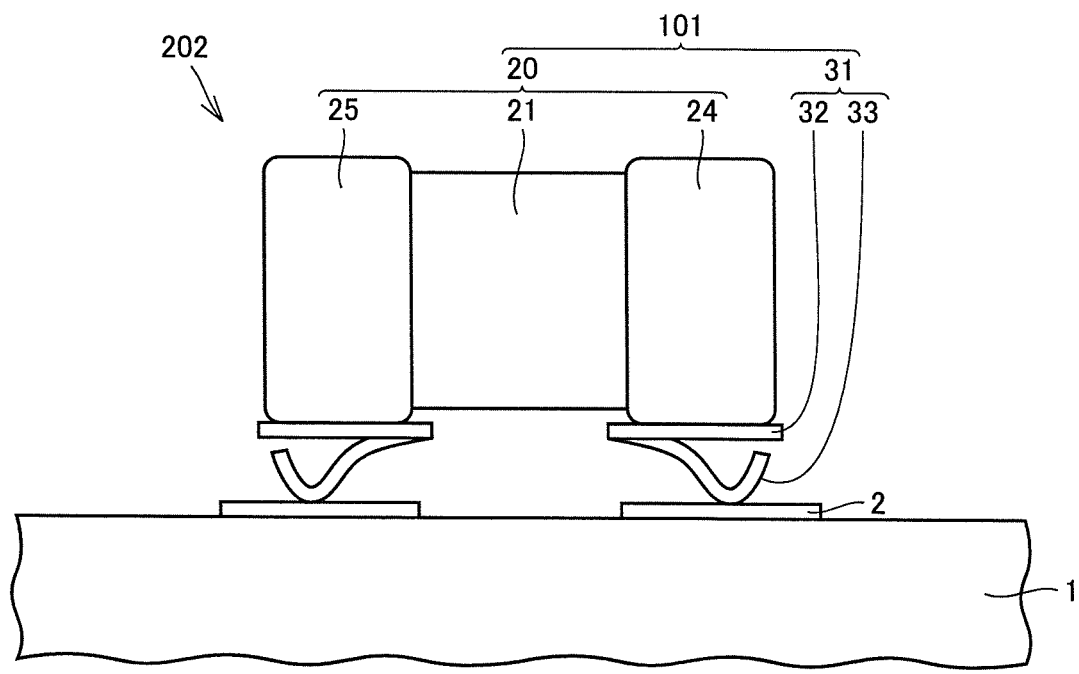
FIG. 12 is a side view of a mounting structure of a laminated electronic component in Preferred Embodiment 3 in accordance with the present invention.

Although Preferred Embodiment 2 has mainly described an example in which a laminated electronic component is mounted with solder 3, a laminated electronic component may be mounted by welding instead of soldering. As Preferred Embodiment 3 in accordance with the present invention, an example in which a laminated electronic component is mounted on a base material by welding will be described with reference to FIG. 12. As shown in FIG. 12, a mounting structure 202 of a laminated electronic component includes base material 1, land 2 arranged on base material 1, and laminated electronic component 101 described in Preferred Embodiment 1, and branch portion 33 of laminated electronic component 101 is welded to land 2.

The same effect as that in Preferred Embodiment 2 can also be obtained in the present preferred embodiment.

Figure 13:
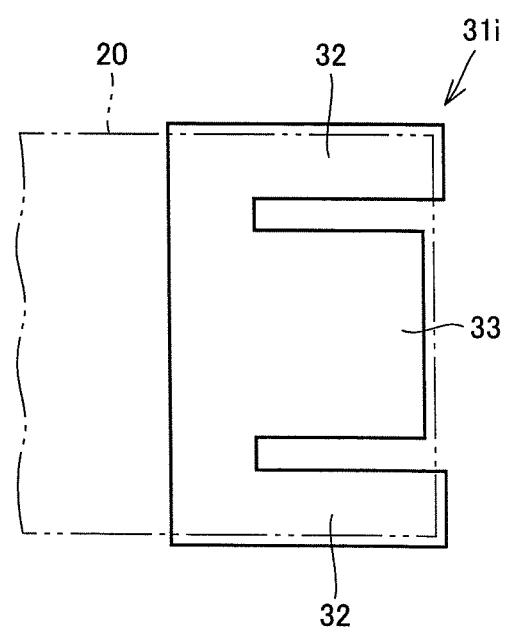
FIG. 13 is a plan view of a first variation of the elastic structure provided in the laminated electronic component.
Figure 14:
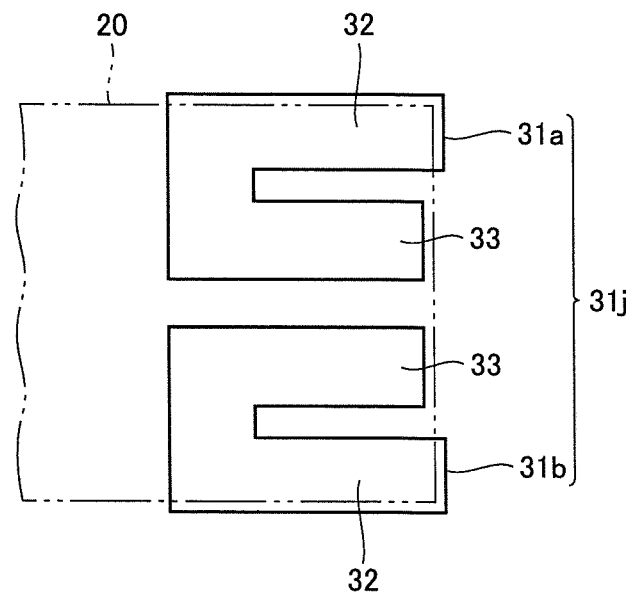
FIG. 14 is a plan view of a second variation of the elastic structure provided in the laminated electronic component.

It is noted that, in each of the preferred embodiments described above, elastic structure 31 has been illustrated as a structure preferably having a comb shape as viewed in plan view. However, the shape of the elastic structure is not limited thereto, and elastic structures having various shapes may be used. Branch portion 33 is not necessarily divided into two branches as shown in FIG. 11. Branch portion 33 may have one integral shape, as in an elastic structure 31*i* shown in FIG. 13. An elastic structure corresponding one external electrode may be divided into two portions as shown in FIG. 14. In the example shown in FIG. 14, an elastic structure 31*j* is divided into a portion 31*a* and a portion 31*b*. Branch portion 33 does not necessarily extend toward an end of laminated ceramic capacitor element 20 as viewed in plan view from the base material 1 side. For example, branch portion 33 may extend toward a side opposite to an end of laminated ceramic capacitor element 20, as in an elastic structure 31*k* shown in FIG. 15. The elastic structure is not limited to have a comb shape at all, and may have a complicated shape as shown for example in FIG. 16. It is satisfactory as long as the elastic structure is connected to the external electrode at at least corner portions 15 of laminated ceramic capacitor element 20. Although the elastic structure may be connected to any of external electrodes 24, 25, it is preferable that elastic structures are connected to both external electrodes 24, 25, respectively, to be oriented symmetrical to each other.

The laminated ceramic capacitor element can be manufactured as described below.

A ceramic dielectric sheet is prepared, and an internal electrode is formed on the ceramic dielectric sheet. As a method for forming the internal electrode, a method such as screen printing can be adopted. Next, a plurality of ceramic dielectric sheets each having the internal electrode formed thereon are laminated to form a mother block. The mother block is divided into chips to form ceramic bodies. As a method for dividing the mother block, a method such as press cutting, dicing, or the like can be adopted.

The chip-shaped ceramic bodies are enclosed within a small box called barrel together with media balls having a hardness higher than that of ceramic. By rotating the barrel, ridge line portions and corner portions of the ceramic bodies are rounded to have a curved surface.

Thereafter, the ceramic bodies are fired and sintered.

Subsequently, a ceramic body is held on an adhesive sheet by fixing one end surface of the ceramic body to the adhesive sheet, and the other end surface of the ceramic body is immersed in a conductive paste. The conductive paste thus attached to the ceramic body is dried to form a metal layer. Another metal layer is similarly formed at the one end surface. The metal layers are baked to form sintered metal layers.

Next, an external electrode is finished by plating each sintered metal layer with Ni and Sn in order. As a result, a laminated ceramic capacitor element is completed.

It is noted that the external electrode may be made of a conductive resin paste. When the external electrode is formed of a conductive resin paste, acoustic noise is effectively reduced or prevented, because the resin attenuates vibration.

Elastic structures are connected to the laminated ceramic capacitor element to obtain a laminated electronic component in accordance with a preferred embodiment of the present invention. The laminated electronic component in this case is a laminated ceramic capacitor.

Figure 17:
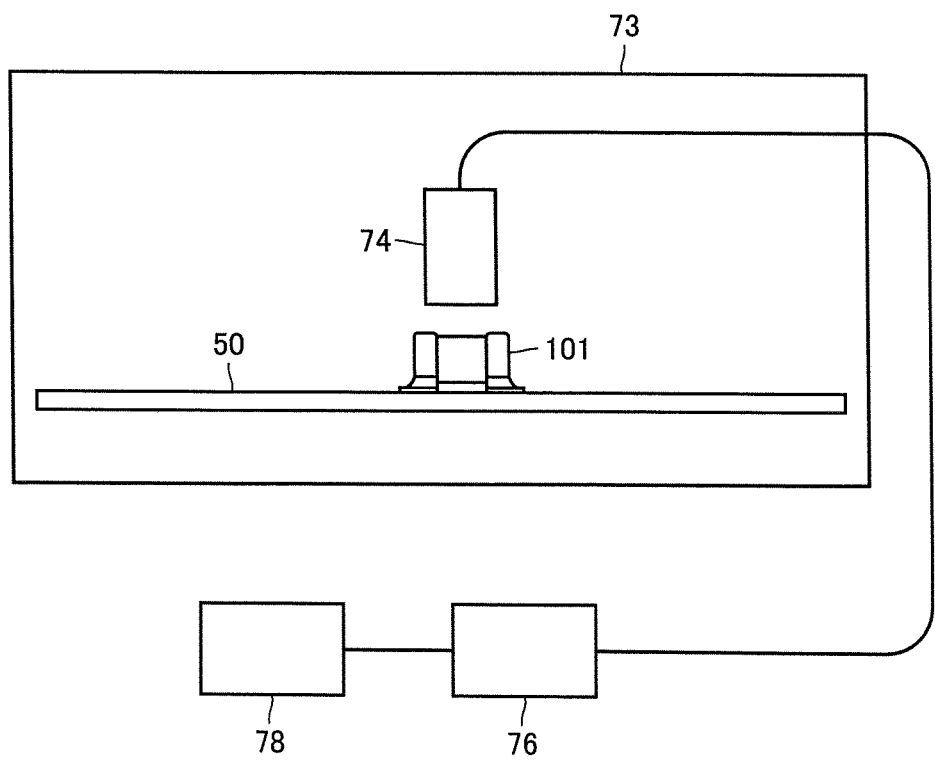
FIG. 17 is an explanatory view of a method for measuring a sound pressure level of acoustic noise.

For reference, a method for measuring a sound pressure level of acoustic noise will be described with reference to FIG. 17. The sound pressure level can be measured, for example, as described below.

Laminated electronic component 101 as a laminated ceramic capacitor is mounted on a circuit substrate 50 having a shape of a square of approximately 40 mm×40 mm and a thickness of about 1.6 mm, for example. Circuit substrate 50 having laminated electronic component 101 mounted thereon is placed within an anechoic box 73. In this state, an AC voltage having a frequency of 3 kHz and a voltage of 1 Vpp is applied to laminated electronic component 101. A sound-collecting microphone 74 is arranged to face circuit substrate 50 to collect sound, and a sound pressure level of the collected sound is measured by a sound collection meter 76 and an FFT analyzer 78.

Figure 20:
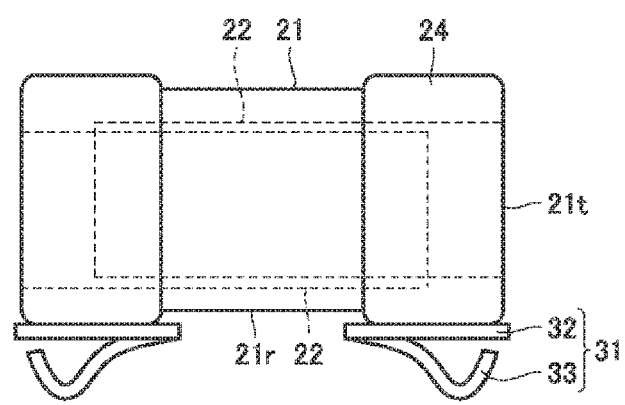
FIG. 20 is another side view of a laminated electronic component as the Experimental Example 1.

It is noted that, in each of the preferred embodiments described above, the relation between first main surface 21r and the lamination direction in laminate 21 of the laminated electronic component is not limited to one pattern. For example, surfaces of internal electrodes 22 may be perpendicular or substantially perpendicular to first main surface 21r, as shown in FIG. 20. Depending on the conditions such as the frequency of the AC voltage, it may be preferable to arrange the both to be perpendicular or substantially perpendicular to each other as described above. Alternatively, the surfaces of internal electrodes 22 may be parallel or substantially parallel to first main surface 21r as shown in FIG. 6. Depending on the conditions such as the frequency of the AC voltage, it may be preferable to arrange the both to be parallel or substantially parallel to each other as described above.

The inventors conducted a comparative experiment in order to confirm the degree of advantageous effects of various preferred embodiments of the present invention. For the comparative experiment, three samples of Experimental Examples 1, 2 and a comparative example were prepared.

Figure 18:
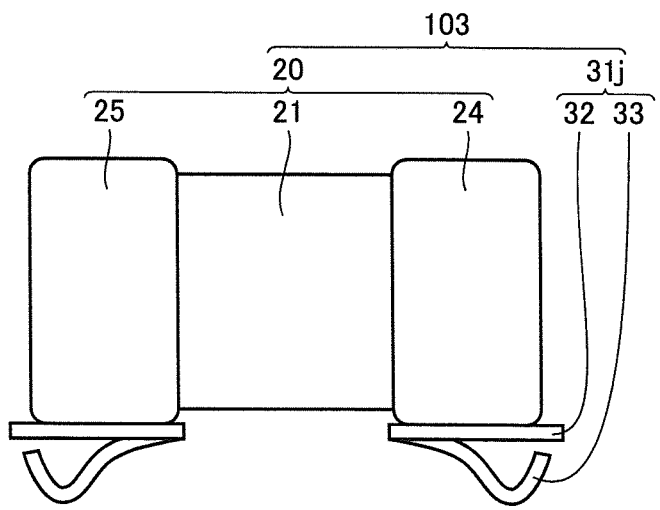
FIG. 18 is a side view of a laminated electronic component as an Experimental Example 1.

As "Experimental Example 1", a laminated electronic component 103 having a structure as shown in FIG. 18 was prepared. Laminated electronic component 103 includes elastic structures 31 shown in FIG. 11.

Figure 19:
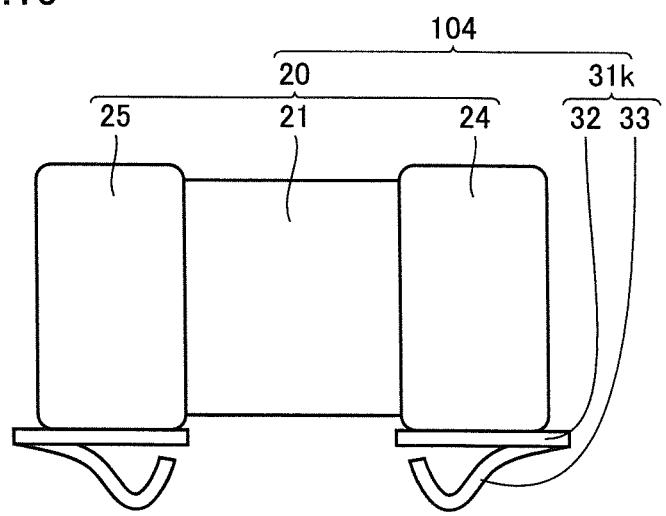
FIG. 19 is a side view of a laminated electronic component as an Experimental Example 2.

As "Experimental Example 2", a laminated electronic component 104 having a structure as shown in FIG. 19 was prepared. Laminated electronic component 104 includes elastic structures 31k shown in FIG. 15.

As the "comparative example", a laminated electronic component having no elastic structure was prepared.

It is noted that laminated ceramic capacitor elements 20 included in Experimental Examples 1, 2 and the comparative example, respectively, have the same specification.

A circuit substrate having a sample mounted thereon by being joined with solder was placed within an anechoic box. An AC voltage having a frequency of 1 kHz to 4 kHz and a voltage of 1 Vpp was applied to the sample, sound was collected by a sound-collecting microphone, and a sound pressure level of the collected sound was measured by a sound collection meter and an FFT analyzer. The highest value of the frequency of 1 kHz to 4 kHz included in the measured sound pressure level was defined as the sound pressure level of the sample. Sound pressure levels were thus measured for the three samples and compared.

Table 1 shows detailed conditions and measurement results.

TABLE 1

Figure 15:
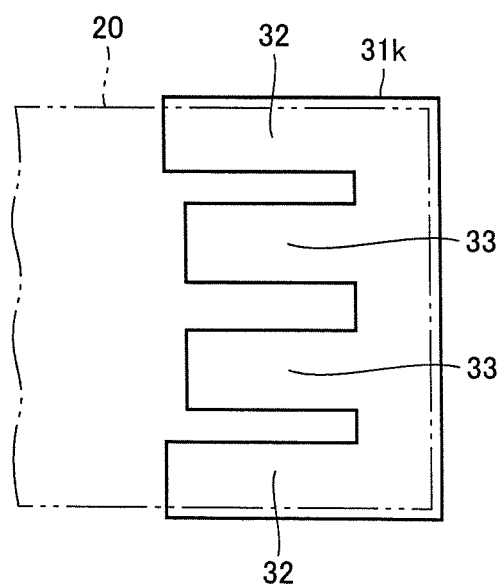
FIG. 15 is a plan view of a third variation of the elastic structure provided in the laminated electronic component.
Figure 16:
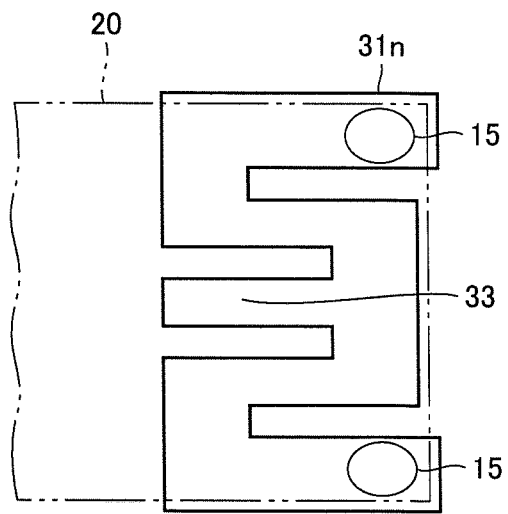
FIG. 16 is a plan view of a fourth variation of the elastic structure provided in the laminated electronic component.

| | | Experimental Example 1 | Experimental Example 2 | Comparative Example |
|---|---|---|---|---|
| Laminated Ceramic Capacitor | External Dimension L [mm] | 3.2 | 3.2 | 3.2 |
| | External Dimension W [mm] | 2.5 | 2.5 | 2.5 |
| | External Dimension H [mm] | 2.5 | 2.5 | 2.5 |
| | Capacitance [μF] | 10 | 10 | 10 |
| | Orientation of Internal Electrodes | Parallel | Parallel | Parallel |
| Shape of Elastic Structure | | FIG. 11 | FIG. 15 | No Elastic Structure |
| Sound Pressure Level [dB] (Maximum Sound Pressure Level within Range of 1 kHz to 4 kHz) | | 67 | 62 | 73 |

As is clear from Table 1, the comparative example had the highest sound pressure level, followed by Experimental Example 1, and then Experimental Example 2. Accordingly, it was determined that Experimental Examples 1, 2 reduce the sound pressure level, i.e., acoustic noise, to a lower level, when compared with the comparative example. In particular, it was determined that Experimental Example 2 reduces the sound pressure level, i.e., acoustic noise, to the lowest level.

The reason that Experimental Example 1 and Experimental Example 2 achieved lower acoustic noises than that of the comparative example is thought to be as described above as the function and effect in Preferred Embodiment 1, that is, as described below.

In both of Experimental Examples 1, 2, since the elastic structure is connected to external electrode 24 at at least corner portions 15, and corner portion 15 is a portion with small displacement as described above, vibration in laminate 21 caused by the piezoelectric effect is less likely to be transmitted to the elastic structure. Further, even if the vibration is transmitted to the elastic structure, the elastic structure plays a role of attenuating the vibration, because it includes branch portion 33 having elasticity. Therefore, it is thought that the elastic structure reduces the degree of transmission of the vibration to the circuit substrate.

Further, the reason that Experimental Example 2 had a lower acoustic noise than that of Experimental Example 1 is thought to be as described below. Specifically, the fulcrum of the elastic structure is situated close to the center in Experimental Example 1, whereas the fulcrum of the elastic structure is situated close to an outer side in Experimental Example 2. As initially shown in FIGS. 3 and 5, the amount of displacement of laminated ceramic capacitor element 20 increases with approaching a central portion of laminate 21. When the fulcrum of the elastic structure is situated close to the center as in Experimental Example 1, the fulcrum of the elastic structure is pressed significantly by the deformation of laminated ceramic capacitor element 20, and thus the effect of absorbing vibration by the elastic structure is decreased. On the other hand, when the fulcrum of the elastic structure is situated close to the outer side as in Experimental Example 2, even if laminated ceramic capacitor element 20 is deformed as shown in FIGS. 3 and 5, the position pressed by the deformation is away from the fulcrum of the elastic structure, and thus it is thought that the effect of absorbing vibration by the elastic structure is increased.

It can be the from the result of the experiment that, in applying various preferred embodiments of the present invention, the configuration as in Experimental Example 2 is preferable to increase the effect of reducing acoustic noise. Specifically, it can be the that branch portion 33 of the elastic structure provided in the laminated electronic component is preferably branched from base portion 32 from a side away from the center of laminate 21 to a side close to the center of laminate 21.

Although the preferred embodiments of the present invention have been described, it should be understood that the preferred embodiments disclosed herein are illustrative and non-restrictive in every respect. The scope of the present invention is defined by the scope of the claims, and is intended to include any modifications within the scope and meaning equivalent to the scope of the claims.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A laminated electronic component, comprising:
    a laminate including internal electrodes and dielectric layers laminated alternately, and including a first main surface;
    an external electrode provided to continuously cover at least one end surface of the laminate in a longitudinal direction and a portion of the first main surface adjacent to the one end surface; and
    a conductive elastic structure connected to the external electrode at at least corner portions of the first main surface in a portion where the external electrode covers the first main surface; wherein
    the conductive elastic structure includes:
        a base portion connected to the external electrode to extend along the first main surface; and
        at least two branch portions branched from the base portion and extending at a position spaced from the first main surface to connect to another electrode, and having elasticity;
    the base portion and the at least two branch portions include an integral plate material, and the at least two branch portions includes a bent and plastically deformed portion of the plate material;
    the base portion extends from a corner of the laminate in a longitudinal direction from the at least one end surface of the laminate towards an opposed end surface of the laminate;
    when viewed in plan view, the at least two branch portions are spaced away from and adjacent to the base portion in a width direction of the laminate perpendicular to the longitudinal direction and extends in the longitudinal direction parallel or substantially parallel to the base portion;
    the at least two branch portions are each branched from the base portion at an acute angle relative to the corresponding branch portion;
    the base portion is located on two sides of the at least two branch portions; and
    the base portion and the at least two branch portions are integrated as a single piece.

2. The laminated electronic component according to claim 1, wherein surfaces of the internal electrodes are perpendicular or substantially perpendicular to the first main surface.

3. The laminated electronic component according to claim 1, wherein surfaces of the internal electrodes are parallel or substantially parallel to the first main surface.

4. The laminated electronic component according to claim 1, wherein the at least two branch portions are branched from the base portion from a side away from a center of the laminate to a side close to the center of the laminate.

5. The laminated electronic component according to claim 1, wherein the laminate has a rectangular or substantially rectangular parallelepiped shape.

6. A mounting structure of a laminated electronic component, comprising:
    a base material;
    a land arranged on the base material; and
    the laminated electronic component according to claim 1; wherein
    the at least two branch portions of the laminated electronic component are joined to the land with solder in a state abutting thereon, and the solder is not in contact with the base portion and the laminate.

7. The mounting structure according to claim 6, wherein surfaces of the internal electrodes are perpendicular or substantially perpendicular to the first main surface.

8. The mounting structure according to claim 6, wherein surfaces of the internal electrodes are parallel or substantially parallel to the first main surface.

9. The mounting structure according to claim 6, wherein the at least two branch portions are branched from the base portion from a side away from a center of the laminate to a side close to the center of the laminate.

10. The mounting structure according to claim 6, wherein the laminate has a rectangular or substantially rectangular parallelepiped shape.

11. A mounting structure of a laminated electronic component, comprising:
    a base material;
    a land arranged on the base material; and
    the laminated electronic component according to claim 1; wherein
    the at least two branch portions of the laminated electronic component are welded to the land.

12. The mounting structure according to claim 11, wherein surfaces of the internal electrodes are perpendicular or substantially perpendicular to the first main surface.

13. The mounting structure according to claim 11, wherein surfaces of the internal electrodes are parallel or substantially parallel to the first main surface.

14. The mounting structure according to claim 11, wherein the at least two branch portions are branched from the base portion from a side away from a center of the laminate to a side close to the center of the laminate.

15. The mounting structure according to claim 11, wherein the laminate has a rectangular or substantially rectangular parallelepiped shape.

\* \* \* \* \*